United States Patent [19]

Lee et al.

[11] Patent Number: 5,028,864
[45] Date of Patent: Jul. 2, 1991

[54] OPTICALLY STABLE, LARGE TIME BANDWIDTH ACOUSTO-OPTIC HETERODYNE SPECTRUM ANALYZER WITH FIXED NON-ZERO HETERODYNE OUTPUT

[75] Inventors: John N. Lee, Silver Spring; Ray B. Brown, Jr., Upper Marlboro, both of Md.

[73] Assignee: The United States of America as represented by the Secretary of the Navy, Washington, D.C.

[21] Appl. No.: 582,277

[22] Filed: Sep. 14, 1990

[51] Int. Cl.$^5$ .............................................. G01R 23/16
[52] U.S. Cl. .................................. 324/77 K; 350/358; 356/346
[58] Field of Search .................... 350/358; 356/346; 324/77 K, 96

[56] References Cited

U.S. PATENT DOCUMENTS

| | | | |
|---|---|---|---|
| 4,531,196 | 7/1985 | Lin | 350/358 |
| 4,644,267 | 2/1987 | Tsui | 324/77 K |
| 4,725,774 | 2/1988 | Davis | 324/77 K |

Primary Examiner—Kenneth A. Wieder
Assistant Examiner—Jose M. Solis
Attorney, Agent, or Firm—Thomas E. McDonnell; George Jameson

[57] ABSTRACT

A common-path interferometric acoustic-optic heterodyne spectrum analyzer having high immunity to ambient vibration uses two, counter-propagating beams, two Bragg cells for beam diffraction, a series of waveplates and a birefringent quartz wedge. Proper light polarization with the waveplates and Bragg cell geometry allows one Bragg cell to diffract primarily the clockwise beam and the other Bragg cell to diffract the counter-clockwise beam. The birefringent quartz wedge shifts the diffracted beams to provide a heterodyne signal with a non-zero IF carrier frequency. The analyzer is highly angle compensated and alignment stable when components are disturbed in position or orientation.

26 Claims, 1 Drawing Sheet

OPTICALLY STABLE, LARGE TIME BANDWIDTH ACOUSTO-OPTIC HETERODYNE SPECTRUM ANALYZER WITH FIXED NON-ZERO HETERODYNE OUTPUT

BACKGROUND OF THE INVENTION

1. Field of the Invention

The invention relates to a radio frequency spectrum analyzer and, in particular, to an acousto-optic heterodyne spectrum analyzer. More specifically, the invention relates to a spectrum analyzer of this type having improved inherent optical stability.

2. Prior Art

Instantaneous spectral analysis of an unknown radio frequency (rf) signal into a large number of discrete output channels, by optical diffraction from a corresponding acoustic wave in a Bragg cell, is a known application of acousto-optics. To increase the dynamic range of optical detection at the Fourier-transform plane of the Bragg cell and to retrieve the phase information in the transform, heterodyne or interferometric techniques have been used, where generally a second Bragg cell driven by a broadband rf reference introduces a set of optical local oscillator beams that mix with the unknown signal beam to produce channel outputs that are amplitude and phase modulations of an IF carrier. The IF carrier frequency is desired to be the same for all channels and is generally low compared to the unknown signal frequency.

However, the use of two Bragg cells in this way introduces severe implementation difficulties, especially when the system is required to operate in a noisy environment. The Bragg cells (BC1, BC2) must be placed into different arms of an interferometer, such as a Mach-Zehnder (M-Z) interferometer shown in FIG. 1. The two arms are adjusted so that light from a source S, diffracted by a first beam splitter (BS1) into two beams (1 and 2), corresponding to the unknown signal and to the local oscillator reference signal, are combined at a second beam splitter (BS2) and propagated together to a detector (D) where they generate the heterodyne signal. Both arms must be held stable with respect to each other to maintain constant heterodyne efficiency and to minimize phase changes that can corrupt the accuracy of the phase information. For example, there may be slowly changing alignment of the optical components due to differential thermal effects, plus rapid alignment changes due to vibration of components. In the Mach-Zehnder interferometer, these result in time-dependent misalignment between the output beams and unequal differential path length changes which modulate both the phase and amplitude of the heterodyne signal. In applications where valuable information is contained in the phase and where good short term and long term phase stability are both needed, the necessary stability is difficult to achieve in independent path arrangements such as the Mach-Zehnder.

To obtain a steady noise-free heterodyne signal, the two diffracted beams must remain parallel. However, in the arrangement of FIG. 1, if there is an unwanted angular disturbance of the Bragg cells (BC1, BC2) or the mirrors (M1, M2) in any direction, the angle between the output beams is changed by twice the angular disturbance. Since the two paths are independent, a disturbance in one path can change the path length of that path while the other path length remains unchanged. This differential path length change can cause an advance or retardation of the phase of the heterodyne signal from the detector. This phase noise or "jitter" can mask the phase information on the rf signal.

Also, in the arrangement of FIG. 1, in order to obtain a non-zero frequency in the heterodyne signal, the two diffracted beams must be carefully misaligned by a very small angle corresponding to the frequency difference between the rf signal and reference frequencies. The Mach-Zehnder type interferometer is difficult to align because of the many independent degrees of freedom which must be adjusted, and it is likewise difficult to obtain a small angle offset.

By improving the optical stability of the spectrum analyzer, a number of advantages are possible. The noise modulation on the amplitude and phase of the heterodyne signal due to unwanted ambient vibrational disturbances is reduced. Improved alignment stability of the output beams allows greater spectral resolution and hence a larger effective time-bandwidth product, i.e., a larger number of heterodyne channels, and reduced amplitude modulation allows the theoretical dynamic range to be approached more closely. Finally, increasing the inherent stability of the optical system reduces the need to take extreme measures to obtain stability by other means, such as by a massive, ultrarigid construction.

One way to minimize vibrational and thermal instability in interferometric systems is to use a suitable common-path arrangement in which some or all of the misalignments cancel, due to symmetry and the fact that both beams are made to follow the same path. The triangular, common-path interferometer (TCPI) is one such arrangement which also provides a smaller number of mechanical components.

However, the reduced number of mechanical degrees of freedom in the TCPI which leads to improved stability, makes the two output beams always parallel to each other, and thus cannot be misaligned by ordinary means to provide for the desired fixed intermediate frequency (IF) offset between the signal and reference frequencies. Also, since the TCPI requires both beams to pass through both Bragg cells, this results in reduction of the beam energy, or beam depletion. Beam depletion puts an unwanted "complementary" version of the reference channel signal into the signal channel and vice-versa, delayed in time by the increased path to the detector. This unwanted signal, or "crosstalk", interferes with the desired heterodyne signal and wastes optical power, so it must be minimized.

Implementation of an interferometric spectrum analyzer is most difficult where the number of output frequency channels is large. Acousto-optic technology presently allows the decomposition of a frequency band into more than 1000 narrow-frequency channels that are detected by the pixel elements of a photodetector array 33. By using currently available Bragg cells, 40-us time apertures can be achieved with 50 MHz bandwidth, giving a time-bandwidth product, or number of channels, of 2000 with high diffraction efficiency, on the order of 50% per rf watt and greater. These are large aperture, on-axis cut tellurium dioxide ($TeO_2$), acoustic shear wave Bragg cells.

Examples of pertinent prior art are described in U.S. Pat. Nos. 2,764,055, 3,473,031, 4,636,718 and 4,725,774. Davis et al. (4,725,774) relates to an interferometric acousto-optic spectrum analyzer which avoids some of the problems associated with the Mach-Zehnder arrangement by integrating the optics on a substrate. Geometrically, this invention uses the unstable Mach-Zehnder arrangement, where reflectors and beam splitters are replaced by Bragg diffraction cells, but does not suffer as much mechanical instability as with discrete optics because integrated-optic techniques are used.

White (3,473,031) relates to a triangular common-path laser transmitter for generation of simultaneous frequency modulated and unmodulated beams. The clockwise and counterclockwise laser beams are polarization separated over a portion of the path between two Faraday rotators. A Kerr cell or other light modulator between the rotators phase modulates the beams differently. Clemens et al. (2,764,055) is similar, and relates to the precise rotation of the plane of polarization of light beams traveling in opposite directions using Faraday rotators instead of Kerr cells for a more stable rotation angle, illustrated by a TCPI arrangement which is not essential to the invention. However, stable rf or microwave spectrum analysis is not possible with either of these devices.

Labrum et al. (4,636,718) relates to an acousto-optic spectrum analyzer of the standard non-heterodyne type using a single Bragg cell. Electronic circuitry is used to expand the frequency resolution.

SUMMARY OF THE INVENTION

Accordingly, an object of this invention is to provide an acousto-optic rf spectrum analyzer of a common-path interferometric type.

Another object of the invention is to provide a spectrum analyzer of the foregoing type with a fixed non-zero heterodyne output IF frequency.

Another object of the invention is to provide a spectrum analyzer of the foregoing type which has a large time-bandwidth.

Another object of the invention is to provide a spectrum analyzer of the foregoing type having improved inherent optical stability so that noise modulation on the amplitude and phase of the heterodyne signal due to unwanted ambient vibrational disturbances is reduced.

Another object of the invention is to provide a spectrum analyzer of the foregoing type which minimizes crosstalk between the two diffracted beams.

Another object of the invention is to provide a spectrum analyzer of the foregoing type with a fixed frequency offset between the input and reference signals, by polarization control and a birefringent quartz wedge, thus permitting improved electrical phase measurement and maximum heterodyne efficiency at the fixed frequency. To maintain the inherent stability of the system, the optical provision for the frequency offset must not be easily altered.

Another object of the invention is to provide an acousto-optic rf spectrum analyzer of the common-path interferometric type which has at least three sides.

A further object of the invention is to provide an acousto-optic rf spectrum analyzer of a triangular common-path interferometric type.

These and other objects of the invention are attained in a spectrum analyzer of the common-path interferometric type which uses two counter-propagating beams, a birefringent quartz wedge, two Bragg cells and a series of quarter waveplates. Proper light polarization with the waveplates and Bragg cell geometry permits one of the Bragg cells to diffract primarily the clockwise beam and the other cell to diffract the counterclockwise beam. The birefringent quartz wedge shifts the heterodyne signal to a non-zero IF carrier frequency.

DESCRIPTION OF THE PREFERRED EMBODIMENT

Although the invention will be described in terms of a triangular, common-path interferometric arrangement, it should be understood that a common-path interferometer arrangement having more than three sides is within the purview of the invention.

Figure 1:
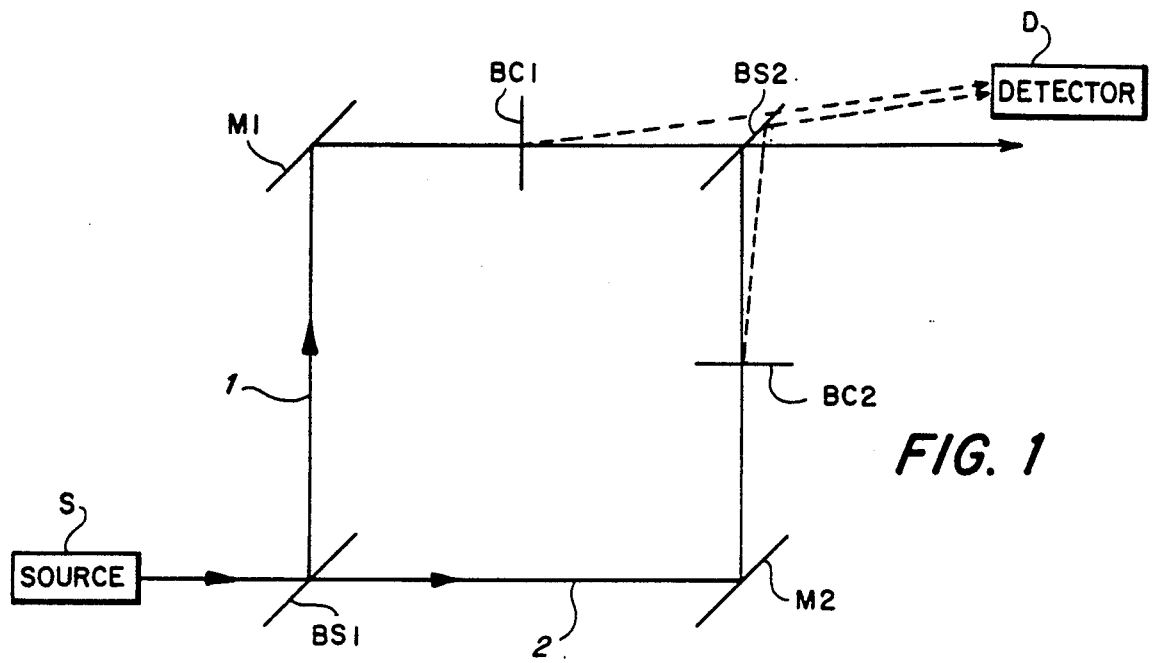
FIG. 1 illustrates a known independent-path interferometric spectrum analyzer (Mach-Zehnder type).
Figure 2:
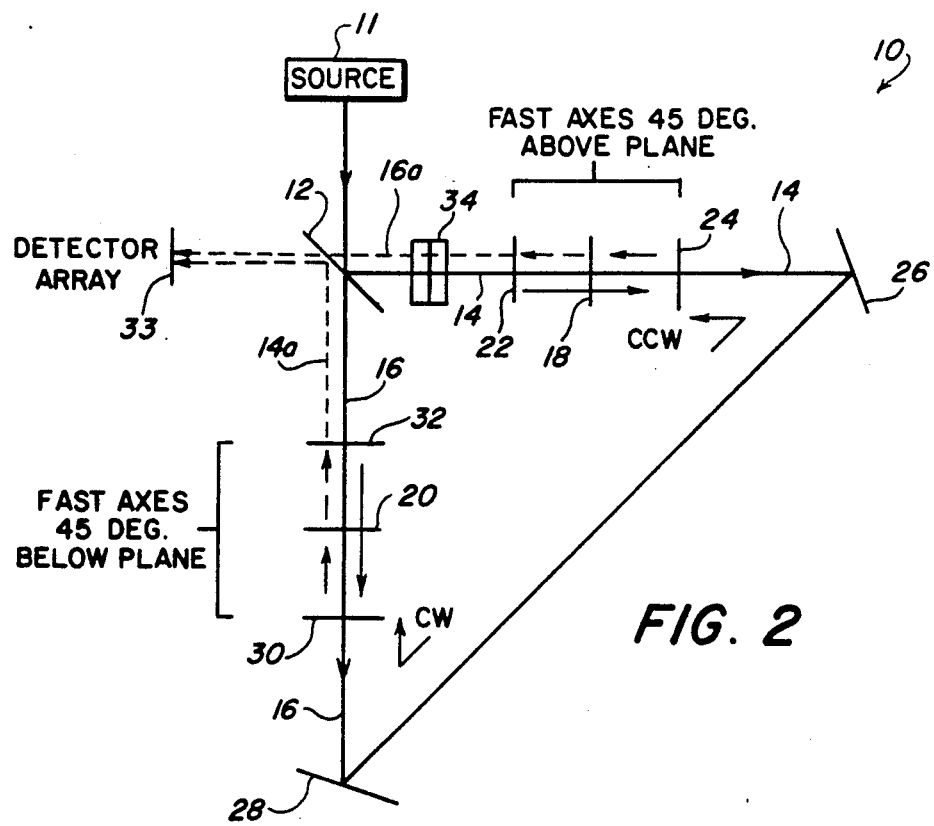
FIG. 2 illustrates a triangular common-path interferometer spectrum analyzer of the present invention.

The improved acousto-optic heterodyne spectrum analyzer of the present invention makes use of a triangular common-path interferometer (TCPI) arrangement which is a symmetric, triangular modification of the Sagnac interferometer, and is shown schematically in FIG. 2 and identified generally by numeral 10. The angle of diffraction by each Bragg cell shown in FIG. 2 (to be explained) lies in the plane normal to that of FIG. 2 that contains the beams incident on each Bragg cell, and the various beams have been shown separated for greater clarity. On-axis cut, shear acoustic wave, $TeO_2$ cells, which use optical activity birefringent phase matching, and therefore operate with nearly circular polarized light, are used in this embodiment. A collimated light source 11, which may be a suitable laser, is linearly polarized vertically, i.e., normal to the plane of FIG. 2, and a non-polarizing 50/50 beam splitter 12 generates two counter-propagating beams: a clockwise ("CW") beam 14 which is deflected to the right in FIG. 2, and a counterclockwise ("CCW") beam 16 which passes undeviated in FIG. 2. Two Bragg cells 18 and 20 are aligned so that diffraction is normal to the plane of FIG. 2. The design arrangement keeps secondary beams, caused by unwanted multiple reflections, in the plane of the device. Strictly speaking, the undiffracted light does not lie completely in a plane because it is bent slightly by a birefringent quartz wedge element discussed below.

The necessary lenses for focusing and collimating the light from the source 11 are known and have not been shown in FIG. 2 to enhance the clarity of the drawing. Also, as is known, the Bragg cell is a type of acousto-optic cell which produces output light beams which are representative of the rf signal activating the cell. For the purposes of the following description, it will be assumed that Bragg cell 18 is activated by the rf signal for which a spectral analysis is to be performed, and Bragg cell 20 is activated by a reference signal.

The clockwise undiffracted beam 14 (indicated by the solid line), after passing through a first quarter waveplate 22, is left-hand circularly polarized. Bragg cell 18 is oriented so the left-hand circularly polarized beam has a low diffraction efficiency. It is very desirable for this unwanted diffraction from Bragg cell 18 to be weak in order to minimize beam depletion and crosstalk between channels, and also to conserve source power. Any power in the unwanted beam is deflected upward (out of the plane of FIG. 2) and completely blocked by a stop (not shown) located above a second reflector 28. This beam is not shown in the orientation of FIG. 2.

The undiffracted left-hand circularly polarized beam then passes through the Bragg cell 18 and a second quarter waveplate 24, where it becomes horizontal linearly polarized. The horizontal linearly polarized beam is deflected by a first reflector 26 toward the second reflector 28, both of which may be mirrors, and the second reflector deflects the beam toward the beam splitter 12 to form the triangular common-path configuration. Finally, the beam becomes right-hand circularly polarized on passing through a third quarter waveplate 30. The second Bragg cell 20 is oriented to give high diffraction efficiency for the right-hand circularly polarized beam, and a strong diffracted beam is deflected downward (below the plane of FIG. 2) and becomes horizontal linearly polarized on passing through a fourth quarter waveplate 32, as shown by the dashed line 14a. The diffracted horizontal linearly polarized beam 14a is deflected by the beam splitter 12 to a suitable detector array 33, which may be a photodiode array wherein the light beam is detected and electrical signals are produced. These electrical signals are then operated upon by subsequent detection circuitry (not shown).

The situation with the counterclockwise beam 16 is identical in every way to the clockwise beam 14, except that the diffracted beam 16a from the first Bragg cell 18 passes through a birefringent quartz wedge 34 while the diffracted beam 14a from the second Bragg cell 20 does not. After passing through the wedge 34, the diffracted counterclockwise beam 16a passes through the beam splitter 12 to the detector array 33.

The reason for using the birefringent quartz wedge 34 is as follows. When a heterodyne system is properly aligned, the heterodyne (difference) frequency will be zero for any rf input. This is undesirable since measurement of phase and amplitude are made more noisy and difficult at a difference frequency equal to zero. A constant non-zero difference frequency is very desirable because it permits the use of IF amplification following the detector array 33. The wedge 34 refracts the counterclockwise diffracted beam 16a out of the plane of FIG. 2 slightly less than it does the clockwise undiffracted beam 14, making it more parallel to the plane of FIG. 2 and creating a small, fixed misalignment with the other (clockwise) diffracted beam 14a. The wedge 34 is made with its slow axis parallel to the apex of the wedge angle, and the apex is aligned parallel to and above the plane of FIG. 2, with the wedge opening downward. In tests conducted by the inventors, the wedge angle was chosen to be 0.0076 degrees, corresponding to a 100 kHz difference in frequency between the rf signals in the Bragg cells 18 and 20. Wedge 34 was, therefore, designed to permit heterodyne detection of the signal (16a) and reference (14a) diffracted vertical beams, where the optical beam frequencies differ by 100 kHz. Hence, 100kHz is always the heterodyne frequency, permitting IF amplification and improved dynamic range.

In the arrangement of FIG. 2, the primary diffracted beams 14a and 16a are directed along the shortest path to the beam splitter 12 from either of the Bragg cells 18 and 20, and the secondary diffracted beams (weak) are directed along the longer path. If this were reversed, the two primary diffracted beams would have to travel a longer non-common-path route to the detector plane, each beam would have to pass over the alternate Bragg cell, and the system would require a larger beam splitter, wedge, and possibly reflectors. Also, it would be more difficult to block the secondary beams. Hence the arrangement shown in FIG. 2 is preferred.

After diffraction, the two beams follow slightly different paths from the Bragg cells to the beam splitter so cancellation of phase jitter due to the media (usually air) will not be as complete. But since the diffraction angles are small, less than 2°, the result is mostly common path when the shorter diffraction path to the detector 33 is used, as is shown in the embodiment of FIG. 2. This arrangement should also work for Bragg cells in which polarization cannot be controlled to minimize beam depletion and hence crosstalk between the Bragg cells, since the unwanted beams can be completely blocked, if the depletion and loss can be tolerated.

In the TCPI arrangement of FIG. 2, only the diffracted beams 14a and 16a are not completely common-path. Ignoring the diffracted beams for the moment, it can be noted that when the components are aligned so that the clockwise and counterclockwise undiffracted beams traverse the same path, they undergo identical phase perturbations before exiting the interferometer. This is true if the frequencies of disturbance are not too high. The maximum frequency of disturbance f is related to the optical path length and the level of phase jitter $\Delta\phi$ desired by the relationship:

$$\Delta\phi = \left(\frac{\text{optical path length}}{\text{speed of light}}\right) \times f \times 360 \text{ degrees}.$$

For example, the frequency of disturbance cannot exceed 2.4 MHz for an arrangement with a 1.23 meter optical path length for 3.6 degrees phase jitter. It can be shown by inspection that angular disturbance of the beam splitter 12 alone does not change either the parallelism of the output beams or the direction of the output beams. Also, angular disturbance of the reflectors 26 and 28 alone does not change the parallelism. Angular disturbance in the source 11 likewise does not affect parallelism, only direction. Unlike reflectors and beam splitters, angular disturbance of the source produces no differential path length changes between the clockwise and counterclockwise beams.

Calculated differential path length changes, which result in phase noise or phase "jitter" between the two beams when the reflectors or the beam splitter are disturbed, are as low or lower (zero) than for the Mach-Zehnder arrangement. Calculations using simple models, which do not include the quartz wedge, waveplates or diffracted beams, predict no phase jitter due to translational vibration of components for the TCPI, compared to large values for the Mach-Zehnder. Both types of interferometric arrangement suffer from phase jitter due to angular vibration of components, but the TCPI is considerably more stable, as discussed below.

Measurements of phase stability for the TCPI in FIG. 2 have been made using two stable crystal-locked signal sources (not shown) separated by 100 kHz. The heterodyne signal was compared in a linear phase comparator (not shown) with a reference signal containing the phase jitter between the two stable signal sources. The output of the linear phase comparator was thus proportional to the phase jitter introduced by the optical system. The bandwidth of the linear phase detector circuit was approximately 1 kHz, so that spurious modulations of phase above 1 kHz would not be seen. The ambient phase jitter over a period of minutes within this band was less than 2 degrees when a cover was used over the optics to exclude ambient air currents, and when the laser source 11 was adjusted for no laser mode hopping. With no cover, but with room air conditioning producing air currents, the jitter was approximately 4 degrees. Laser mode hopping alone produced a seven degree or more uncertainty.

It can be seen that the above-described TCPI arrangement for an acousto-optic rf spectrum analyzer gives greater immunity to signal degradation in the presence of ambient mechanical vibration and differential mechanical and thermal stress than independent path interferometer arrangements such as the Mach-Zehnder. This results in improved signal dynamic range.

In particular, the angle compensation of the above-described TCPI arrangement, meaning the output beams remain parallel when the reflectors or beam splitter are disturbed, results in a more stable heterodyne signal, i.e., less amplitude modulation due to ambient mechanical vibration. Also, its alignment stability, meaning the output beams change direction less, reduces the tendency for the beams to vibrate with respect to the detector pixels. This also reduces amplitude modulation, and allows greater optical resolution and potentially a larger number of pixels.

The nearly symmetrical, nearly common-path arrangement reduces to zero the differential path length change due to mechanical disturbances, such as the translation of beamsplitter, mirrors and source. In addition, the differential path length due to disturbances, such as mirror rotation in-plane, is reduced to one half that of the non-common path Mach-Zehnder arrangement, providing reduced phase modulation due to ambient mechanical noise.

The birefringent quartz wedge allows the TCPI spectrum analyzer of the present invention to operate with a stable, non-zero heterodyne frequency where electronic measurement of amplitude and phase is more noise free, giving improved dynamic range.

Polarization control allows crosstalk between the signal and reference channel to be reduced, thus permitting greater dynamic range. Also, since the undiffracted light and diffracted light are linearly polarized, a linear polarizer, which is not shown, can be used to discriminate against scattered undiffracted light if desired.

The increased inherent optical stability in the present invention means that less effort to obtain rigidity is required to obtain a given stability, and for some applications may result in lower cost and weight.

Numerous modifications and alternate embodiments are possible in view of the present disclosure. As an example, both the clockwise and counterclockwise beams in the system shown in FIG. 2 will have the same diameter so that the illuminated aperture in each Bragg cell will be the same. However, some applications may require that the aperture sizes in the two cells be different. In this case an afocal telescope of the correct magnification can be located between the reflectors 26 and 28 of FIG. 2 in order to give the required diameters for the two beams.

The birefringent quartz wedge 34, which is a single element in FIG. 2, could be replaced by two wedges located symmetrically in the system. Each wedge would provide half the present offset to both diffracted beams. The increased symmetry should further reduce differential path length change due to ambient mechanical vibration.

Because the sensitivity to mechanical vibration is greater in-plane than out-of-plane, the diffraction plane was chosen to be out-of-plane in FIG. 2. But it is also possible to rotate the Bragg cells, source polarization, etc., 90 degrees to give in-plane operation.

The embodiment of the system tested by the inventors used a circularly symmetric, Gaussian-shaped laser beam source truncated at 25 mm because the waveplates were limited to 25 mm diameter. It has been calculated that best optical resolution and diffraction efficiency can be obtained with an elliptical cross-section beam of a particular size truncated at the largest possible diameter, approximately 50 mm for the present Bragg cell. Hence, a system using larger optical beams should give improved performance.

It is understood that many other changes and additional modifications of the invention are possible in view of the teachings herein without departing from the scope of the invention as defined in the appended claims.

We claim:

1. An acousto-optic heterodyne spectrum analyzer using a common-path interferometer arrangement comprising:
   a source of collimated light;
   means for forming said collimated light into counter propagating first and second light beams;
   a first acousto-optic cell responsive to the signal upon which spectral analysis is to be performed and adapted to diffract primarily said first light beam;
   a second acousto-optic cell responsive to a reference signal and adapted to diffract primarily said second light beam;
   a birefringent element for creating a predetermined misalignment between the diffracted first and diffracted second light beams to create a non-zero heterodyne frequency; and
   detector means for detecting said diffracted first and diffracted second light beams and providing an output signal.

2. An acousto-optic spectrum analyzer as defined in claim 1, wherein said first and said second acousto-optic cells are aligned such that the angles through which said first and second light beams are diffracted lie in planes normal to a reference plane defined by the propagating directions of said counter propagating first and second light beams.

3. An acousto-optic spectrum analyzer as defined in claim 2, wherein each of said first and said second acousto-optic cell is a Bragg cell.

4. An acousto-optic spectrum analyzer as defined in claim 2, further comprising:
   first and second light polarization means associated with said first acousto-optic cell for controlling the polarization of said first light beam; and
   third and fourth light polarization means associated with said second acousto-optic cell for controlling the polarization of said second light beam.

5. An acousto-optic spectrum analyzer as defined in claim 4, wherein each of said first, second, third and fourth polarization means comprises a quarter waveplate.

6. An acousto-optic spectrum analyzer as defined in claim 1, wherein said birefringent element comprises a birefringent quartz wedge.

7. An acousto-optic spectrum analyzer as defined in claim 1, wherein said common-path arrangement is a triangular common-path interferometer arrangement.

8. An acousto-optic spectrum analyzer as defined in claim 2, further comprising first and second reflectors positioned to deflect said first and said second light beams along a triangular common path.

9. An acousto-optic spectrum analyzer as defined in claim 4, further comprising first and second reflectors positioned to deflect said first and said second light beams along a triangular common path.

10. An acousto-optic spectrum analyzer as defined in claim 4, wherein said collimated light source comprises a laser.

11. An acousto-optic spectrum analyzer as defined in claim 4, wherein said means for forming said counter propagating light beams comprises a non-polarizing beam splitter.

12. An acousto-optic spectrum analyzer as defined in claim 3, wherein each said Bragg cell is an acousto-optic cell which uses optical activity birefringent phase matching.

13. An acousto-optic spectrum analyzer as defined in claim 12, wherein each said Bragg cell is an on-axis cut, shear acoustic wave, tellurium dioxide cell.

14. An acousto-optic spectrum analyzer as defined in claim 4, wherein said detector means comprises a photodetector array.

15. An acousto-optic heterodyne spectrum analyzer using a triangular common-path interferometer arrangement comprising:
    a source of collimated light;
    means for forming said collimated light into counter propagating first and second light beams;
    first and second reflectors positioned to deflect said first and said second light beams along a triangular common path;
    a first acousto-optic cell responsive to the signal upon which spectral analysis is to be performed and adapted to diffract said first light beam;
    a second acousto-optic cell responsive to a reference signal and adapted to diffract said second light beam;
    a birefringent element for creating a predetermined misalignment between the diffracted first and diffracted second light beams to create a non-zero heterodyne frequency; and
    detector means for receiving and responding to said diffracted first and diffracted second light beams;
    wherein said first and second acousto-optic cells are aligned such that diffraction of said first and second light beams occurs in a plane normal to a reference plane defined by the propagating directions of said counterpropagating first and second light beams.

16. An acousto-optic spectrum analyzer as defined in claim 15, further comprising:
    first and second light polarization means associated with said first acousto-optic cell for controlling the polarization of said first light beam; and
    third and fourth light polarization means associated with said second acousto-optic cell for controlling the polarization of said second light beam.

17. An acousto-optic spectrum analyzer as defined in claim 15, wherein:
    said means for forming said counter propagating light beams comprises a non-polarizing beam splitter;
    each of said first and said second acousto-optic cells is a Bragg cell; and
    each of said first, second, third and fourth polarization means comprises a quarter waveplate.

18. An acousto-optic spectrum analyzer as defined in claim 17, wherein said birefringent element comprises a birefringent quartz wedge.

19. An acousto-optic heterodyne spectrum analyzer using a common-path interferometer arrangement comprising:
    a source of collimated light;
    first means for forming said collimated light into counter propagating first and second light beams;
    second means adapted to diffract primarily said first light beam;
    third means adapted to diffract primarily said second light beam;
    a birefringent element for creating a predetermined misalignment between the diffracted first and diffracted second light beams; and
    detector means for detecting said diffracted first and diffracted second light beams and providing an output signal.

20. An acousto-optic heterodyne spectrum analyzer as defined in claim 19, wherein:
    said second means includes a first acousto-optic cell responsive to a signal upon which spectral analysis is to be performed and adapted to diffract said first light beam; and
    said third means includes a second acousto-optic cell responsive to a reference signal and adapted to diffract said second light beam.

21. An acousto-optic heterodyne spectrum analyzer as defined in claim 20, wherein:
    said second means further includes first and second light polarization means, said first acousto-optic cell being disposed between said first and second light polarization means; and
    said third means further includes third and fourth light polarization means, said second acousto-optic cell being disposed between said third and fourth light polarization means.

22. An acousto-optic heterodyne spectrum analyzer as defined in claim 21, wherein each of said light polarization means comprises a quarter waveplate.

23. An acousto-optic heterodyne spectrum analyzer as defined in claim 21, wherein:
    each of said first and said fourth light polarization means is a left-hand circularly polarizing means;
    each of said second and third light polarization means is a right-hand circularly polarizing means; and
    each of said acousto-optics cells has a low diffraction efficiency for left-hand circularly polarized light and a high efficiency for right-hand circularly polarized light,
    such that said first light beam is left-hand circularly polarized by said first light polarization means, horizontal linearly polarized by said second light polarization means, right-hand circularly polarized by said third light polarization means, diffracted by said second acousto-optic cell, horizontal linearly polarized by said fourth polarization means and detected by said detector means, and said second light beam is left-hand circularly polarized by said fourth light polarization means, horizontal linearly polarized by said third light polarization means, right-hand circularly polarized by said second light polarization means, diffracted by said first acousto-optic cell, horizontal linearly polarized by said first light polarization means, passed through said birefringent element and detected by said detector means.

24. An acousto-optic heterodyne spectrum analyzer as defined in claim 21, wherein each of said first and second acousto-optic cells is a Bragg cell.

25. An acousto-optic heterodyne spectrum analyzer as defined in claim 19, wherein the common-path interferometer arrangement is triangular.

26. An acousto-optic heterodyne spectrum analyzer as defined in claim 19, wherein the common-path interferometer arrangement has at least three sides.

* * * * *

UNITED STATES PATENT AND TRADEMARK OFFICE
CERTIFICATE OF CORRECTION

PATENT NO. : 5,028,864

DATED : Jul. 2, 1991

INVENTOR(S) : John N. Lee et al.

It is certified that error appears in the above-identified patent and that said Letters Patent is hereby corrected as shown below:

```
Title page, Item 75, after "Inventors:"
      change "John N. Lee, Silver Spring; Ray B.
      Brown, Jr., Upper Marlboro, both of Md."
      to -- John N. Lee, Silver Spring; Ray B.
      Brown, Jr., Upper Marlboro; and Alan E.
      Craig, University Park, all of Md. --.
```

Signed and Sealed this

Thirteenth Day of April, 1993

*Attest:*

STEPHEN G. KUNIN

*Attesting Officer*  *Acting Commissioner of Patents and Trademarks*